United States Patent [19]

Frye

[11] 4,220,955

[45] Sep. 2, 1980

[54] RF COUPLING DEVICE FOR CONNECTING A HAND HELD RADIO TO AN EXTERNAL DEVICE WITHOUT REMOVING THE ANTENNA

[75] Inventor: Eugene O. Frye, Cedar Rapids, Iowa

[73] Assignee: Rockwell International Corporation, El Segundo, Calif.

[21] Appl. No.: 43,296

[22] Filed: May 29, 1979

[51] Int. Cl.[2] .............................................. G01R 25/04

[52] U.S. Cl. ...................................... 343/703; 343/720

[58] Field of Search ................ 343/703, 720, 872, 749

[56] References Cited

U.S. PATENT DOCUMENTS

| | | | |
|---|---|---|---|
| 3,099,807 | 7/1963 | Oh | 333/32 |
| 3,364,487 | 1/1968 | Maheux | 343/702 |
| 3,518,618 | 6/1970 | Swanson | 339/125 R |
| 4,167,738 | 9/1979 | Kirkendall | 343/703 |

*Primary Examiner*—David K. Moore

*Attorney, Agent, or Firm*—Edward A. Gerlaugh; Richard A. Bachand; H. Frederick Hamann

[57] ABSTRACT

An R-F coupling device of greatly improved coupling and shielding characteristics is disclosed for inductive connection to the antenna circuitry of a hand-held transceiver without necessitating the removal of the transceiver antenna.

16 Claims, 2 Drawing Figures

RF COUPLING DEVICE FOR CONNECTING A HAND HELD RADIO TO AN EXTERNAL DEVICE WITHOUT REMOVING THE ANTENNA

BACKGROUND OF THE INVENTION

This invention pertains generally to antenna coupling devices, and more particularly to antenna coupling devices utilizing inductive coupling.

It has become commonplace for small, hand-held radio frequency transceivers to employ short upright stub antennas, usually of the compact helical type in which an open-ended helix is coated with rubber or the like. Such antennas are referred to as "normal-mode helical antennas", and are known in more common parlance as "rubber duck" antennas.

Antennas of the foregoing type commonly represent a compromise between antenna efficiency and compactness or portability, and for the use intended such antennas perform satisfactorily. However, it is sometimes desirable to couple such compact transceivers to a larger antenna of superior transmission characteristics. Further, and for purposes of transceiver testing or the like, it is often desirable to connect the antenna circuitry of such hand-held transceivers to appropriate test circuitry.

In the past, the connection of the antenna circuitry of such a transceiver to either a more efficient antenna or a test equipment usually involved the mechanical disconnection and the physical removal of the compact helical antenna, followed by the connection of a suitable R-F transmission line to the antenna circuitry of the transceiver, the remote end of such transmission line being connected to the test equipment or to the more efficient antenna. However, such a substitution of a transmission line for the "rubber duck" antenna necessitates the use of a transmission line having an R-F connector which physically matches the complementary connector on the transceiver or, alternatively, the use of an adapter for achieving the connection. Further, even in those instances where the proper matching hardware is readily available, it is a significant drawback to have to perform the time-consuming tasks of disconnecting the helical antenna and connecting the transmission line, and then repeating these steps in reverse order, especially in those situations where the substitution has to be performed frequently.

Inductive R-F coupling between the normal antenna of a compact receiver or the like and an auxiliary pick-up coil is shown in U.S. Pat. No. 3,518,681 Kiepe and 3,364,487 Maheux, but in each the antenna and the coupling coil are merely placed in a proximate, side-by-side relationship, resulting in far less efficient coupling than in the device of the present invention, as well as providing little or no radio frequency shielding.

Inductive R-F coupling between two coaxial helices is disclosed in U.S. Pat. No. 3,099,807 Oh, but in a rotary joint for transmission lines, and having little other similarity to the device of the present invention.

SUMMARY OF THE INVENTION

The present invention provides an R-F antenna coupling device which avoids the drawbacks of the prior art. More specifically, the present invention provides such a coupling device with vastly improved coupling characteristics without necessitating physical replacement of the helical antenna of a hand-held transceiver with a transmission line. Further, R-F shielding is provided by the structure of the present invention, unlike the antenna coupling means of the prior art.

Such desirable results are achieved by the present invention by the provision of a conductive cylindrical housing and a helical coupling coil coaxially positioned therein around a central insulating sleeve. The central sleeve is adapted to encompass in a slip-on telescoping relationship the upright antenna to which coupling is desired, and the helical coupling coil positioned on such insulating sleeve is thus inductively coupled with the antenna, preferably also a helix, which it surrounds. The coupling coil and the surrounding electrically conductive casing are so spaced and dimensioned as to be resonant at the operating frequency and to provide a satisfactory impedance match to a transmission line.

The invention is described below in detail, with reference to the accompanying drawings, in which:

FIG. 1 is a perspective view of the antenna coupling device of the present invention, shown in axial relationship with, but removed from, a common hand-held transceiver having a compact helical antenna, and FIG. 2 is a vertical section view of the antenna coupling device of the present invention.

DESCRIPTION OF THE PREFERRED EMBODIMENT

Figure 1:
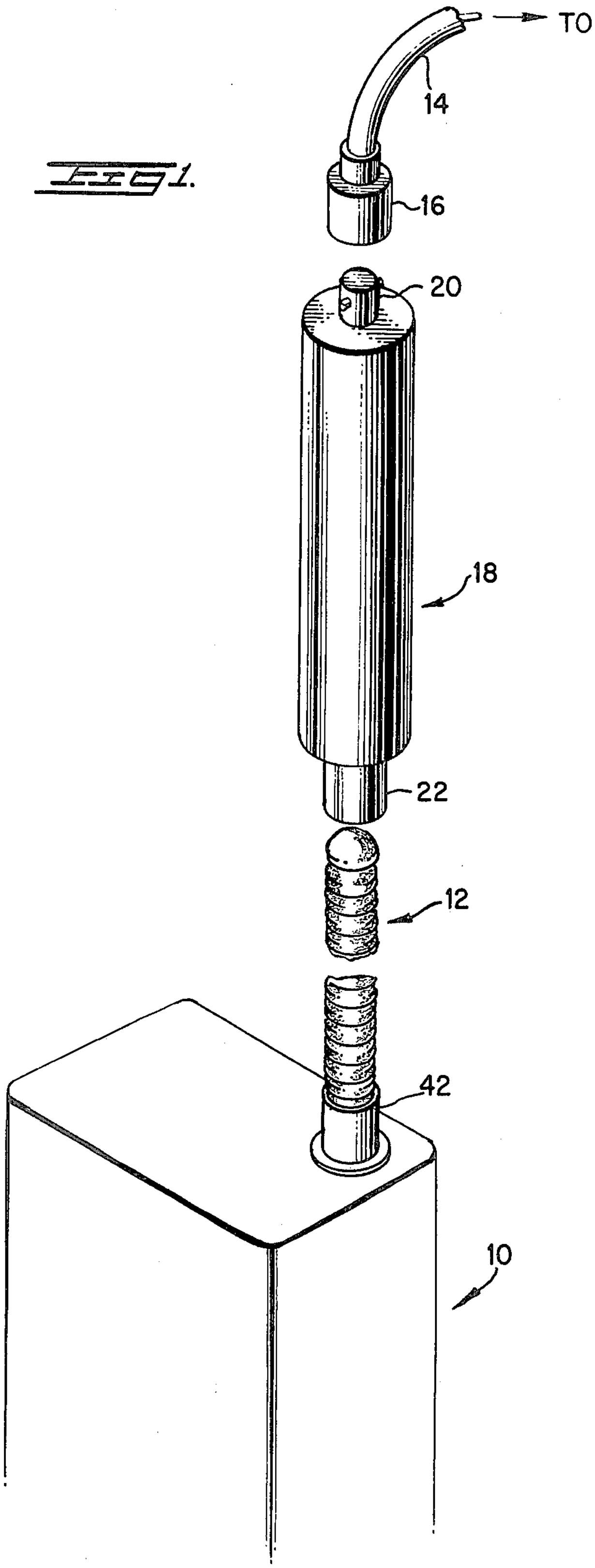

FIG. 1 shows a common hand-held transceiver 10 or the like having situated thereon a compact helical antenna 12 of the type commonly referred to as a "rubber duck" antenna. This antenna 12 constitutes a compromise in design between the most efficient transmitting and receiving characteristics and an antenna size which is compatible with the compactness and portability of the transceiver 10. It is common in the art of VHF portable or hand-held transceivers to have antennas which are such air-core helices, but because they do constitute a compromise in efficiency, the communication range is limited, and while satisfactory for many applications, it is inadequate for long-range transmission. Where it is desirable to effect relatively long range transmission by means of such a hand-held unit, or, alternatively, where it is desired to connect such a compact transceiver to a suitable test circuit, it is a common but tedious practice in the prior art to disconnect the antenna 12 from the transceiver 10 and to connect in its place a radio frequency transmission line, such as line 14 in FIG. 1, connecting the transmission line to the transceiver 10 by means of a connector, such as, typically, coaxial connecter 16. The other end of the transmission line 14 is connected to the larger and more efficient antenna (not shown) or, alternatively, to any suitable test equipment (also not shown). As will be obvious to those skilled in the art, the coaxial connector 16 must necessarily be of a type which will match the connector in transceiver 10 by means of which the helical antenna 12 is connected thereto or, alternatively, a suitable adapter means must be provided to interconnect coaxial connector 16 with a non-matching connector on the transceiver 10.

In accordance with the present invention, an antenna coupling device 18 is provided, employing a coaxial connector 20 which is compatible with the coaxial connector 16 of transmission line 14, and also including a central insulating sleeve 22 of such internal diameter as to provide a slip fit with the outer diameter of the helical antenna 12, permitting the antenna coupling device

18 to be placed over the antenna 12 in telescoping coaxial relationship.

Figure 2:
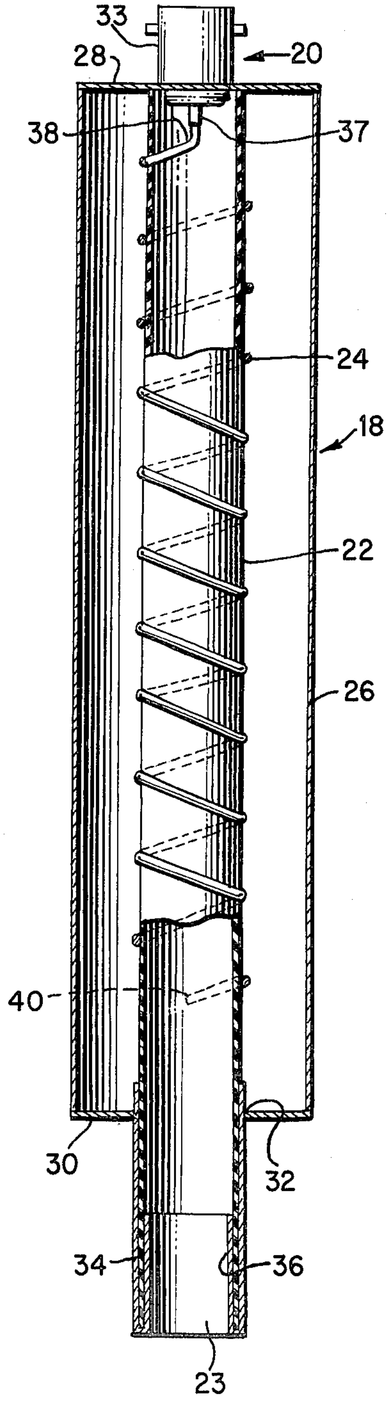

Referring now to FIG. 2, the antenna coupling device 18 of the present invention is shown in vertical central section, and in greater detail than in FIG. 1. The centrally located insulating sleeve 22 is shown with a helical coupling coil 24 mounted thereon, the coil 24 substantially coextensive with the sleeve 22 for a substantial portion of the length thereof. Also mounted on insulating sleeve 22 is an electrically conductive casing 26 having conductive end caps 28, 30 by means of which the casing 26 is mounted in coaxial relationship with the insulating central sleeve 22, the casing 26 forming a hollow cylindrical chamber or cavity surrounding the coil 24. As may be seen in FIG. 2, the insulating sleeve 22 abuts end cap 28, while extending through a central aperture 32 in conductive end cap 30. An outer contact member or shielding conductor 33 of coaxial connector 20 is centrally affixed and conductively connected to the disc shaped end cap 28 which, in turn, is conductively connected to the body of the casing 26. This conductive connection is continuous through the casing 26 to the conductive end cap 30, and further to an open end 23 of insulating sleeve 22 by means of a conductive foil wrap 34 completely covering the exposed end of insulating sleeve 22, as well as wrapping around the open end 23 and extending into the interior of insulating sleeve 22, as indicated at 36 in FIG. 2. A central contact member or conductor 37 of coaxial connector 20 is insulated from the conductive circuit of the casing 26, but is conductively connected to one end of the helical coupling coil 24, remote from the open end of the sleeve 22 as at 38. An open end 40 of helical coupling coil 24 is not conductively connected to any part of the circuit, and in this sense the coupling coil 24 is substantially the inverse of the antenna 12 of the transceiver 10 in FIG. 1, the remote end of the antenna 12 also not being conductively connected to any of the circuitry. Antennas such as that indicated at 12 in FIG. 1 are termed "normal-mode helical antennas", and the coupling coil 24 of the present invention may thus be termed an "inverse normal-mode helical antenna".

The operation and the method of using the antenna coupling device of the present invention is apparent. The circuitry which it is desired to couple to the transceiver 10 is connected to the transmission line 14, the latter being connected to the antenna coupling device 18 of the present invention by means of coaxial connectors 16, 20. The antenna coupling device 18 is merely slipped over or placed upon the air-core helical antenna 12, the antenna 12 supporting and holding the coupling device 18 in place without any mechanical securing means or connectors. When the antenna coupling device 18 is in place, the conductive foil 36 inside the open end 23 of the sleeve 22 serves to complete the connection of the shielding conductor of the coupling device 18 to a shielding conductor of the transceiver 10, such as shielding conductor 42, FIG. 1. Thus in place, the coil 24 substantially surrounds and is inductively coupled to the helical antenna 12. Further, as a result of the selected dimensions of the various members of the antenna coupling device 18, such device is resonant to the operating frequency of the transceiver 10, the coupling coil 24 acting in effect like the central conductor of a coaxial cable, with the conductive casing 26 acting as the shielding conductor. Thus, radio frequency energy present in the antenna 12 is coupled to the transmission line 14 by means of the coupling device 18, and, similarly, radio frequency energy present in the transmission line 14 is coupled to the antenna 12 by means of the coupling device 18. A return of the transceiver 10 to its normal mode of operation with the antenna 12 is achieved simply by slidably removing the coupling device 18 from its position around antenna 12.

Normal-mode helical antennas such as that indicated at 12 in FIG. 1 are inherently resonant devices exhibiting relatively sharp tuning characteristics. In order for the inverse normal-mode helical antenna or coupling coil 24 to operate efficiently, it must be tuned to the operating frequency of the antenna 12. Assuming that no capacitance loading is utilized, the length of coupling coil 24 may be approximated by the following relationship wherein any consistent set of units may be used:

$$h=\lambda/4(1+20(ND)^{5/2}(D/\lambda)^{1/2})^{-1/2},$$

for $$ND^2/\lambda<1/5$$

where h is coil length

N is number of turns per unit length

D is mean helix diameter

λ is free-space wavelength of operating frequency

The electrical "Q" or sharpness of resonance of the helix can be expressed by the following formula:

$Q=\pi Z_0/4R_{base}$, where $R_{base}=(25.3\ h/\lambda)^2+3.175(1.25\ (h/D)^{1/5})/dF^{1/2}$ $Z_0=60(\lambda/4h)\ (\ln\ (4h/D)-1)$ ohms d is wire diameter in millimeters F is frequency in MHz Simply by way of example, the antenna coupling device 18 of the present invention was constructed as follows for operation in the 150MHz region: The helical coupling coil 24 was formed by space-winding thirty-one turns of #22E wire on the central insulating sleeve 22, the latter being a 210 millimeter length of cylindrical, thinwall coil form having an inside diameter of 15 millimeters. The overall length of the coil 24 was 155 millimeters; the end 40 of the coil 24 was trimmed as needed to adjust for optimum coupling. The conductive casing 26 was 175 millimeters long and 40 millimeters in diameter, the sleeve 22 protruding 35 millimeters beyond the end cap 30. The end portion 36 of conductive foil wrap 34 extended inside the open end 23 of the sleeve 22 a distance of 20 millimeters. A standard BNC coaxial connector was affixed centrally to the end cap 28 of the casing 26.

Thus, the invention has been described in considerable detail, and particularly with respect to its application to utilization with air-core helical antennas as described; it will be obvious to those skilled in the art that the invention is also applicable to coupling to other elongate upright antennas. Further, the conductive elements 26, 28 and 30 may be formed of any suitable metal such as copper, or may be of some other lighter weight material such as plastic with a conductive coating deposited or bonded thereon. Similarly, the protruding end of insulating sleeve 22 may be rendered conductive by means of a metallic foil wrap as indicated, or by some other conductive coating. Hence, the invention is not to be considered as limited to the particular details given, nor to the specific application to which reference has been made during the description of the preferred embodiment of the apparatus, except insofar as may be required by the scope of the appended claims.

What is claimed is:

1. A coupling device providing R-F energy coupling to a compact helical antenna in the absence of fixed mechanical coupling thereto, comprising:
a central cylindrical insulating sleeve open at one end and having an internal diameter in excess of the external diameter of such helical antenna,
a helical coupling coil mounted on said insulating sleeve in coaxial relationship therewith,
an outer casing including a cylindrical electrically conductive sleeve with conductive end caps and having an internal diameter in excess of the external diameter of said coupling coil, said conductive casing being mounted on said central insulating sleeve in coaxial relationship, and
an R-F transmission line connector having first and second contact members and being mounted externally on said casing, and first contact member being insulated from said casing and conductively connected to the end of said helical coupling coil farther from said open end of said insulating sleeve,
the conductive end cap of said casing nearer said open end of said insulating sleeve having a central circular aperture therein having a diameter in excess of the outside diameter of said insulating sleeve,
whereby mere placement of said antenna coupling device over such helical antenna in coaxial telescoping relationship effects inductive coupling of R-F energy between said coupling device and such antenna.

2. A coupling device in accordance with claim 1, wherein the excess of said internal diameter of said insulating sleeve over the external diameter of such helical antenna is just sufficient to permit a sliding fit of said antenna coupling device over such helical antenna.

3. A coupling device in accordance with claim 1, wherein the excess of said internal diameter of said casing over the external diameter of said coupling coil is sufficient to constitute a hollow chamber around said coupling coil of appropriate dimensions for effecting proper impedance matching and tuning.

4. A coupling device in accordance with claim 1, wherein said R-F transmission line connector is mounted on the conductive end cap of said casing remote from said open end of said insulating sleeve.

5. A coupling device in accordance with claim 1, wherein said coil and said insulating sleeve are substantially coextensive.

6. A coupling device in accordance with claim 5, wherein said R-F transmission line connector is mounted on the conductive end cap of said casing remote from said open end of said insulating sleeve.

7. A coupling device in accordance with claims 1, 4 or 6 wherein said R-F transmission line connector is a coaxial connector having said first contact member as a center conductor and said second contact member as a shielding conductor.

8. A coupling device in accordance with claim 1, wherein said open end of said central insulating sleeve is external of said conductive casing, said insulating sleeve extending through said central circular aperture.

9. A coupling device in accordance with claim 8, further comprising an electrically conductive member on the protruding open end of said insulating sleeve, said conductive member being electrically connected to the adjacent conductive end cap and extending to the open end of said insulating sleeve.

10. A coupling device in accordance with claim 9, wherein said conductive member on said protruding sleeve is a conductive foil wrap.

11. An antenna coupler providing R-F energy coupling between a compact helical antenna of a transceiver and an external device, comprising:
a sleeve of insulating material having one open end, said antenna insertable in said sleeve through the open end;
a coil mounted on said sleeve in coaxial relationship therewith, said coil substantially enveloping said antenna when said antenna is fully inserted in said sleeve;
a conductive casing mounted on said sleeve and surrounding said coil, said casing separated dielectrically from said coil, said casing including means for establishing a conductive connection between said casing and a shielding conductor of said transceiver when said antenna is fully inserted in said sleeve, said coil and said casing arranged in coaxial relationship to form, respectively, a center conductor and a shielding conductor of said coupler; and
a R-F energy transmission line coupleable to said external device and including first and second conductors, the first conductor being connected conductively to an end of said coil, the second conductor being connected conductively to said casing, whereby mere insertion of said antenna into said sleeve effects the coupling of R-F energy between said antenna and said transmission line.

12. An antenna coupler as claimed in claim 11, wherein said transmission line includes at least a coaxial connector having a central conductor surrounded by a shielding conductor.

13. An antenna coupler as claimed in claim 12, wherein the coaxial connector extends axially outward from said casing and said sleeve at an end of said sleeve remote from the open end, the conductive connection between the second conductor and said casing being effected by mounting the shielding conductor of the coaxial connector to said casing, the central conductor passing through an aperture in said casing, and the conductive connection between the first conductor and said coil being effected between the central conductor and the end of said coil.

14. An antenna coupler as claimed in claims 11, 12 or 13, wherein said sleeve of insulating material is a cylindrical coil form.

15. An antenna coupler as claimed in claims 11, 12 or 13, wherein said conductive casing comprises a cylindrical chamber having closures at either end thereof, said sleeve passing through a central aperture of the closure nearer the open end of said sleeve, the open end of said sleeve extending outwardly, externally of said casing.

16. An antenna coupler as claimed in claim 15, wherein the means for establishing the conductive connection between said casing and the shielding conductor of said transceiver, comprises conductive foil on and inside the externally extending open end of said sleeve.

* * * * *